(12) United States Patent
Baier et al.

(10) Patent No.: US 12,719,481 B2
(45) Date of Patent: Aug. 25, 2026

(54) MULTI-PHASE CLOCK GENERATION DEVICE

(71) Applicant: NXP B.V., Eindhoven (NL)

(72) Inventors: Thomas Baier, Graz (AT); Jan van Sinderen, Liempde (NL); Jens Fleischhacker, Hamburg (DE)

(73) Assignee: NXP B.V., Eindhoven (NL)

( * ) Notice: Subject to any disclaimer, the term of this patent is extended or adjusted under 35 U.S.C. 154(b) by 184 days.

(21) Appl. No.: 18/582,790

(22) Filed: Feb. 21, 2024

(65) Prior Publication Data

US 2024/0313785 A1 Sep. 19, 2024

(30) Foreign Application Priority Data

Mar. 17, 2023 (EP) .................................... 23162622

(51) Int. Cl.
*H03L 7/081* (2006.01)
*H03L 7/24* (2006.01)

(52) U.S. Cl.
CPC .......... *H03L 7/0814* (2013.01); *H03L 7/0812* (2013.01); *H03L 7/24* (2013.01)

(58) Field of Classification Search
CPC ........ H03L 7/0812; H03L 7/0814; H03L 7/24
See application file for complete search history.

(56) References Cited

U.S. PATENT DOCUMENTS 9,479,150 B1 * 10/2016 Lin ........................ H03K 5/135
2005/0242868 A1 11/2005 Lutkemeyer
2013/0043918 A1 2/2013 Ma
2016/0105189 A1 4/2016 Maeda et al.
2018/0013435 A1 1/2018 Namkoong et al.

FOREIGN PATENT DOCUMENTS

WO 2021092601 A2 5/2021
WO 2021092601 A3 5/2021

OTHER PUBLICATIONS

Gao et al., "Low-Jitter Multi-phase Clock Generation: A Comparison between DLLs and Shift Registers," 2007 IEEE International Symposium on Circuits and Systems, May 27-30, 2007, 4 pages.
Wang et al., "Multi-Phase Clock Generation for Phase Interpolation With a Multi-Phase, Injection-Locked Ring Oscillator and a Quadrature DLL," IEEE Journal of Solid-State Circuits, vol. 57, No. 6, Jun. 2022, 12 pages.
Nagaraju et al., "Process. Variation Tolerant Design Techniques for Multiphase Clock Generation," 2010 17th IEEE International Conference on Electronics, Circuits and Systems, Dec. 12-15, 2010, 4 pages.

* cited by examiner

*Primary Examiner* — Patrick O Neill

(57) ABSTRACT

Embodiments of a multiphase clock generation device may include an input for feeding a reference clock, a clock generation unit adapted to generate phase-shifted clock signals from the reference clock, and a phase comparator unit functionally coupled with the clock generation unit. The phase comparator unit is adapted to measure a phase shift of the phase-shifted clock signals. The multiphase clock generation device includes a self-calibration unit that is functionally coupled with the clock generation unit. The calibration unit outputs a delay-calibration parameter to the clock generation unit. The clock generation unit is adapted to generate a multiphase clock signal out of the reference clock and the delay-calibration parameter.

20 Claims, 8 Drawing Sheets

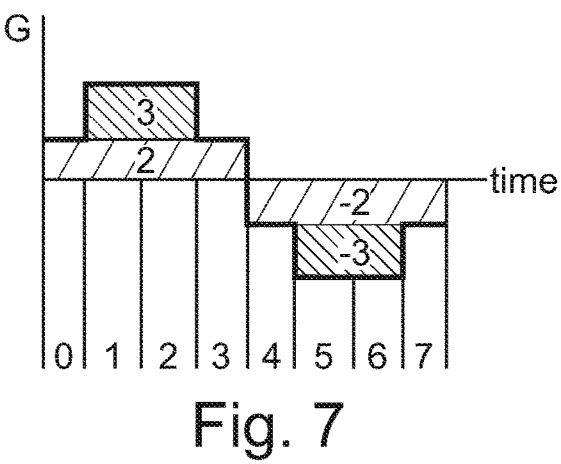
Fig. 7
| Phase | Gain I | Gain Q |
|---|---|---|
| 0 | 2 | 5 |
| 1 | 5 | 2 |
| 2 | 5 | -2 |
| 3 | 2 | -5 |
| 4 | -2 | -5 |
| 5 | -5 | -2 |
| 6 | -5 | 2 |
| 7 | -2 | 5 |
Fig. 8
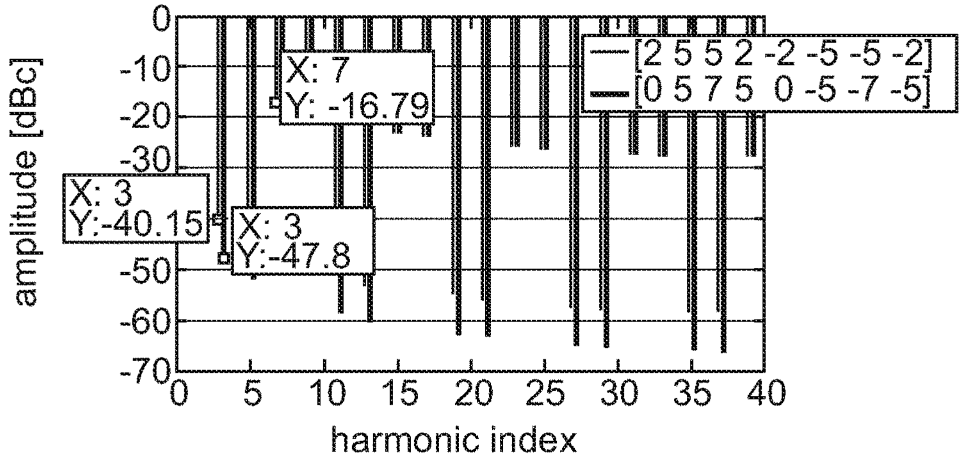
Fig. 9

MULTI-PHASE CLOCK GENERATION DEVICE

CROSS-REFERENCE TO RELATED APPLICATIONS

This application claims the priority under 35 U.S.C. § 119 of European Patent application no. 23162622.7, filed on 17 Mar. 2023, the contents of which are incorporated by reference herein.

TECHNICAL FIELD

The present disclosure relates to a multi-phase clock generation device. Furthermore, the present disclosure relates to a method of operating a multi-phase clock generation device. Furthermore, the present disclosure relates to a computer-implemented method for carrying out the proposed method.

BACKGROUND

Harmonic rejection mixers in RF-systems (radio frequency systems) are used to reduce the sensitivity to interferers which otherwise would be down-converted with harmonics of the local oscillator (LO) clock signal. This can be necessary for wide-band systems where the wanted modulated bandwidth is a significant fraction of the carrier frequency (e.g. for NFC (near field communication)+/−1.5 MHz around 13.56 MHz) and low-order band-pass filters in front of the mixer don't give sufficient attenuation for unwanted signals around the LO harmonics before they are down-converted by e.g. a simple square-wave multiplying mixer. Reduction of the conversion gain for the LO harmonics can be achieved in the mixer by using more LO phases to more accurately reconstruct a multiplication with a single-tone sine wave with reduced harmonic content. Generation of the more LO phases is conventionally done with a high (i.e. higher than the LO frequency) speed clock to accurately delay the phases.

Xiang Gao et al., "Low-Jitter Multi-phase Clock Generation: A Comparison between DLLs and Shift Registers", 2007 discloses that a shift register based multi-phase clock generator (MPCG) generates less jitter than a delay-locked loop (DLL) equivalent when both are realized with current mode logic (CML) circuits and white noise is assumed.

Zhaowen Wang et al., "Multi-Phase Clock Generation for Phase Interpolation With a Multi-Phase, Injection-Locked Ring Oscillator and a Quadrature DLL, 2022 discloses a high-accuracy, low-jitter, multi-phase clock generator (MPCG) based on a multi-phase, injection-locked ring oscillator (MPIL-ROSC) with a quadrature delay-locked loop (QDLL).

SUMMARY

A first aspect the present disclosure is directed to a multi-phase clock generation device, comprising:

- an input for feeding a reference clock;
- a clock generation unit adapted to generate phase-shifted clock signals from the reference clock;
- a phase comparator unit functionally coupled with the clock generation unit, wherein the phase comparator unit is adapted to measure a phase shift of the phase-shifted clock signals; and
- a self-calibration unit functionally coupled with the clock generation unit, wherein the calibration unit outputs a delay-calibration parameter to the clock generation unit, wherein the clock generation unit is adapted to generate a multiphase clock signal out of the reference clock and the delay-calibration parameter.

In this way, the proposed multiphase clock generation device can be operated with a reduced electric current consumption, e.g. compared with known solutions with DLLs/PLLs. This is due to the fact that the self-calibration unit is turned off after the initial self-calibration phase. A single reference clock is used to generate any number of multiphase clock signals.

A further aspect of the present disclosure is directed to a method for operating a multiphase clock generation device, comprising the steps:

- generating of two or more delayed clock signals out of a reference clock;
- determining a phase shift between signals of the input and the output clock signals;
- determining a calibration parameter to compensate process variations of the phase shift;
- generating a multiphase clock out of the reference clock and the calibration parameter.

A further aspect of the present disclosure is directed to a computer-implemented method which, when executed by a multi-phase clock generation device causes said multiphase clock generation device to carry out the proposed method.

In one or more embodiments, the clock generation unit comprises at least two delay cells functionally coupled with each other, wherein each of the delay cells is adapted to generate inverted clock signals with respect to input clock signals.

In one or more embodiments, the delay cells comprise trimmable delay elements, wherein a defined phase delay is generated by means of trimmable delay elements.

In one or more embodiments, the trimmable delay elements are at least one of the following: RC network, current-, voltage-controlled or digital-controlled delay element.

In one or more embodiments, the phase comparator unit is adapted to perform phase detection with a binary or linear search algorithm used in the calibration unit. Such algorithms are known as such and can be used efficiently.

In one or more embodiments, a self-calibration process of the device is performed once and corresponding calibration circuitry is disabled afterwards. Advantageously, a current consumption and/or a noise generation of the device can be reduced in this way.

In one or more embodiments, the phase comparator unit is adapted to check if two clock signals are phase aligned, and depending from a phase shift, to integrate an electric current. In this way, a relationship between phase shifts and a calibration parameter for adjustment of phase shifts of the multiphase clock signals can be created.

In one or more embodiments, the device is used to generate multiphase clock signals for a harmonic rejection mixer. This is only an exemplary application of the present disclosure.

BRIEF DESCRIPTION OF DRAWINGS

The above discussion/summary is not intended to describe each embodiment or every implementation of the present disclosure. The figures and detailed description that follow also exemplify various embodiments. The aspects defined above and further aspects of the present disclosure are apparent from the examples of embodiment to be described herein-after with reference to the appended drawings, which are explained with reference to the examples of embodiment. However, the disclosure is not limited to the examples of embodiment.

All illustrations in the drawings are schematical. It is noted that in different figures, similar or identical elements or features are provided with the same reference signs or with reference signs that are different from the corresponding reference signs only within the first digit. In order to avoid unnecessary repetitions elements or features which have already been elucidated with respect to a previously described embodiment are not elucidated again at a later position of the description.

Figure 1:
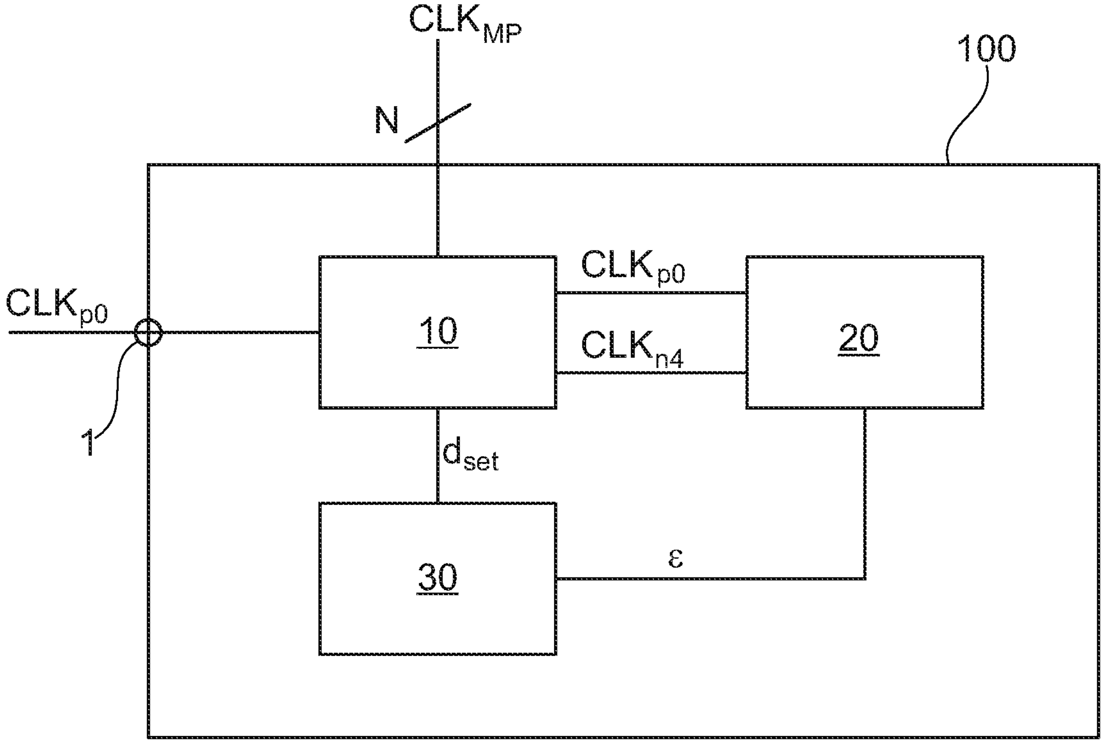
Figure 2:
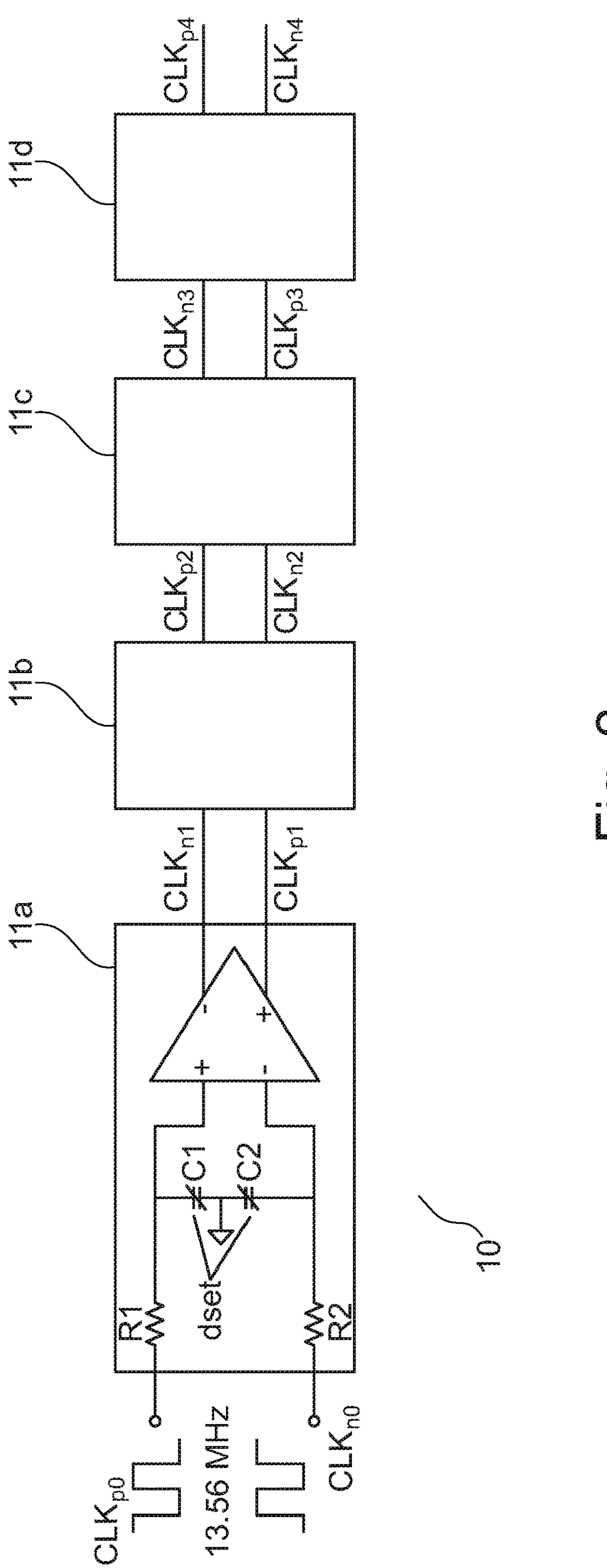
Figure 3:
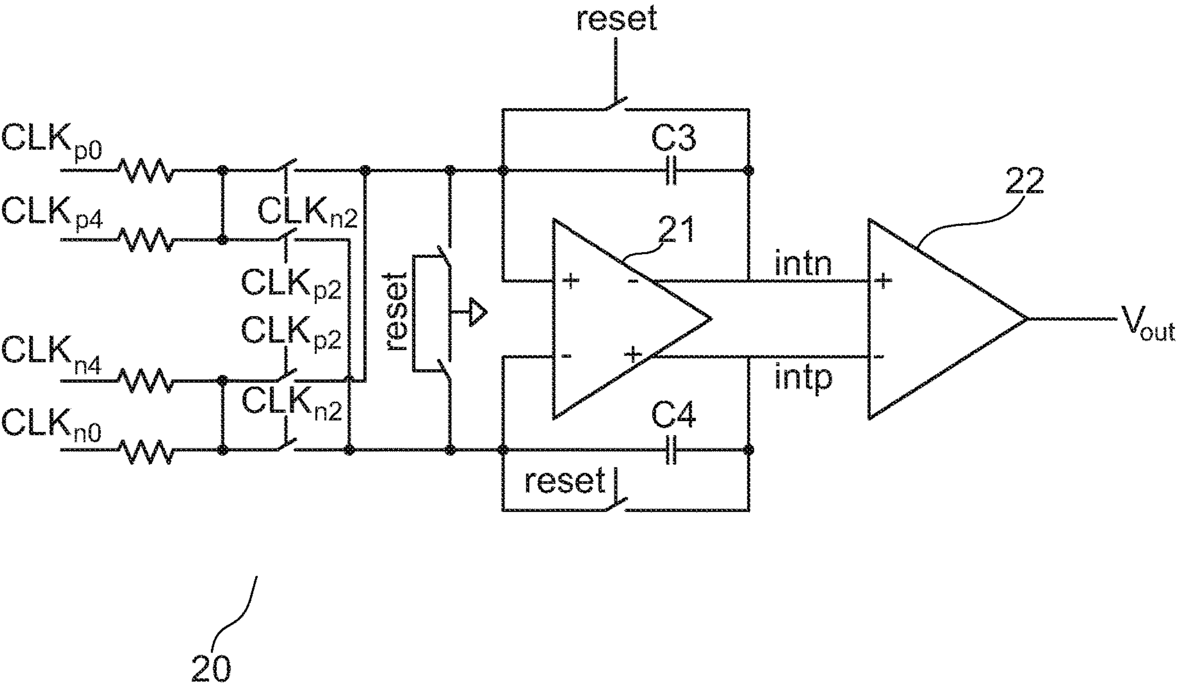
Figure 4:
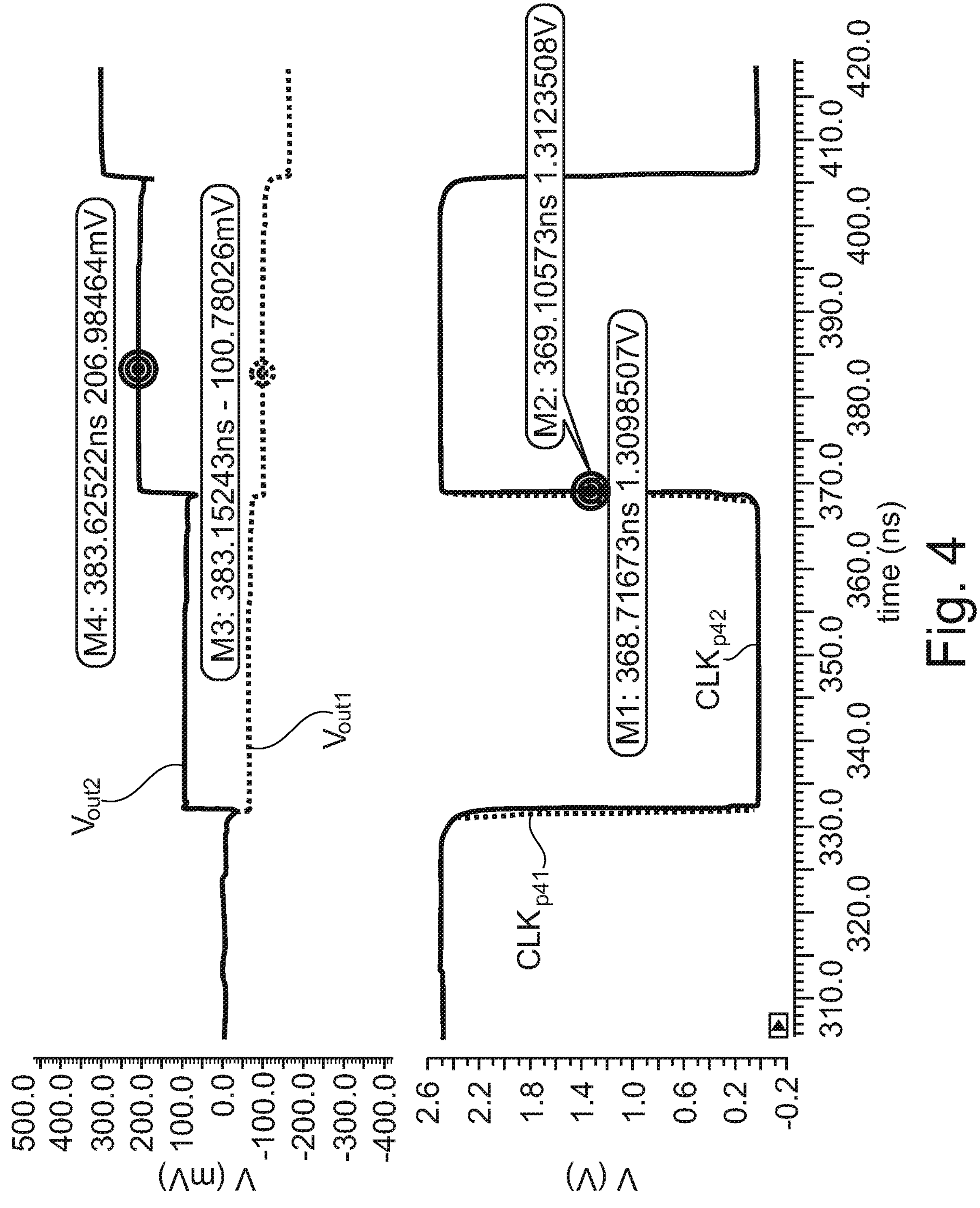
Figure 5:
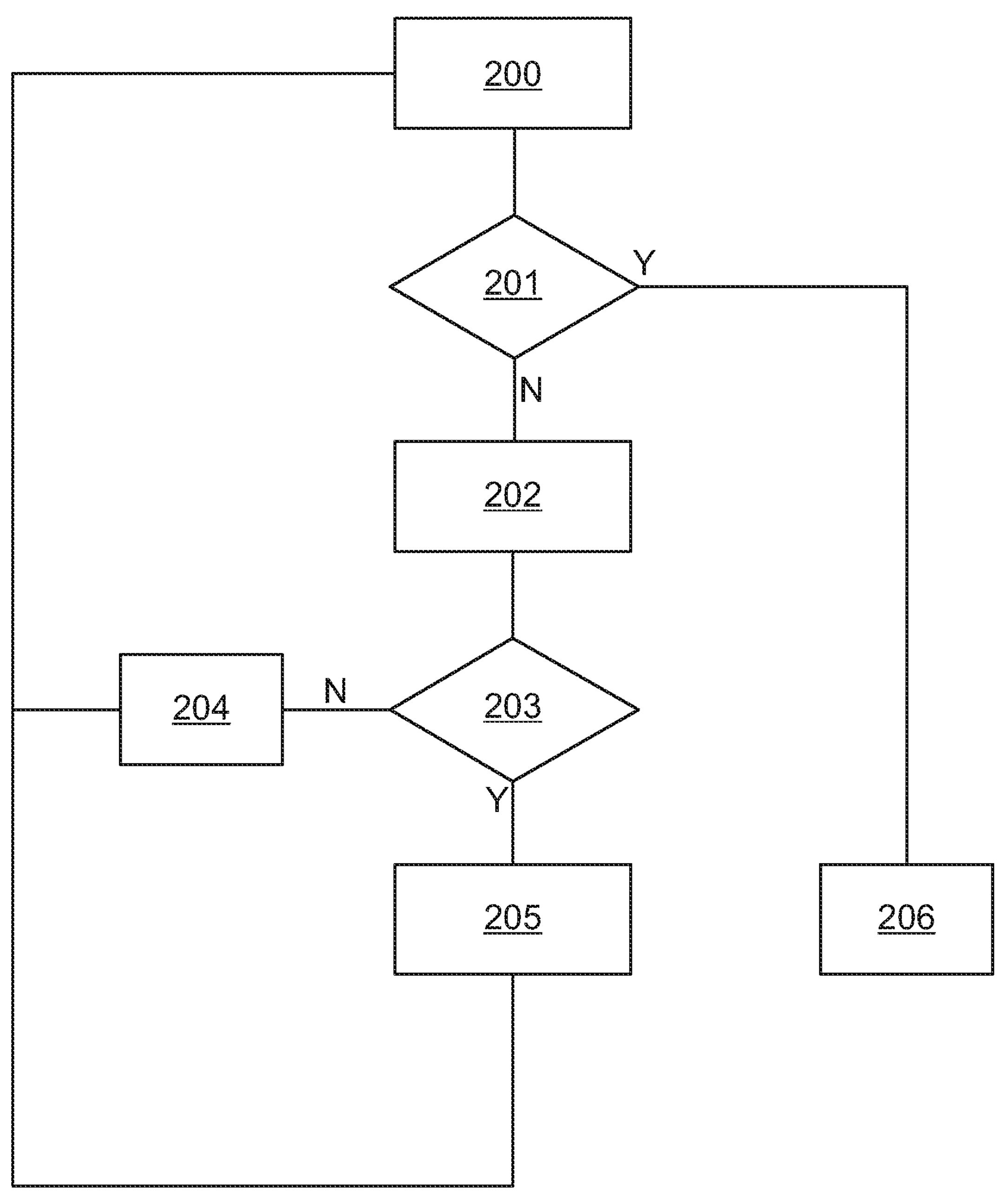
Figure 6:
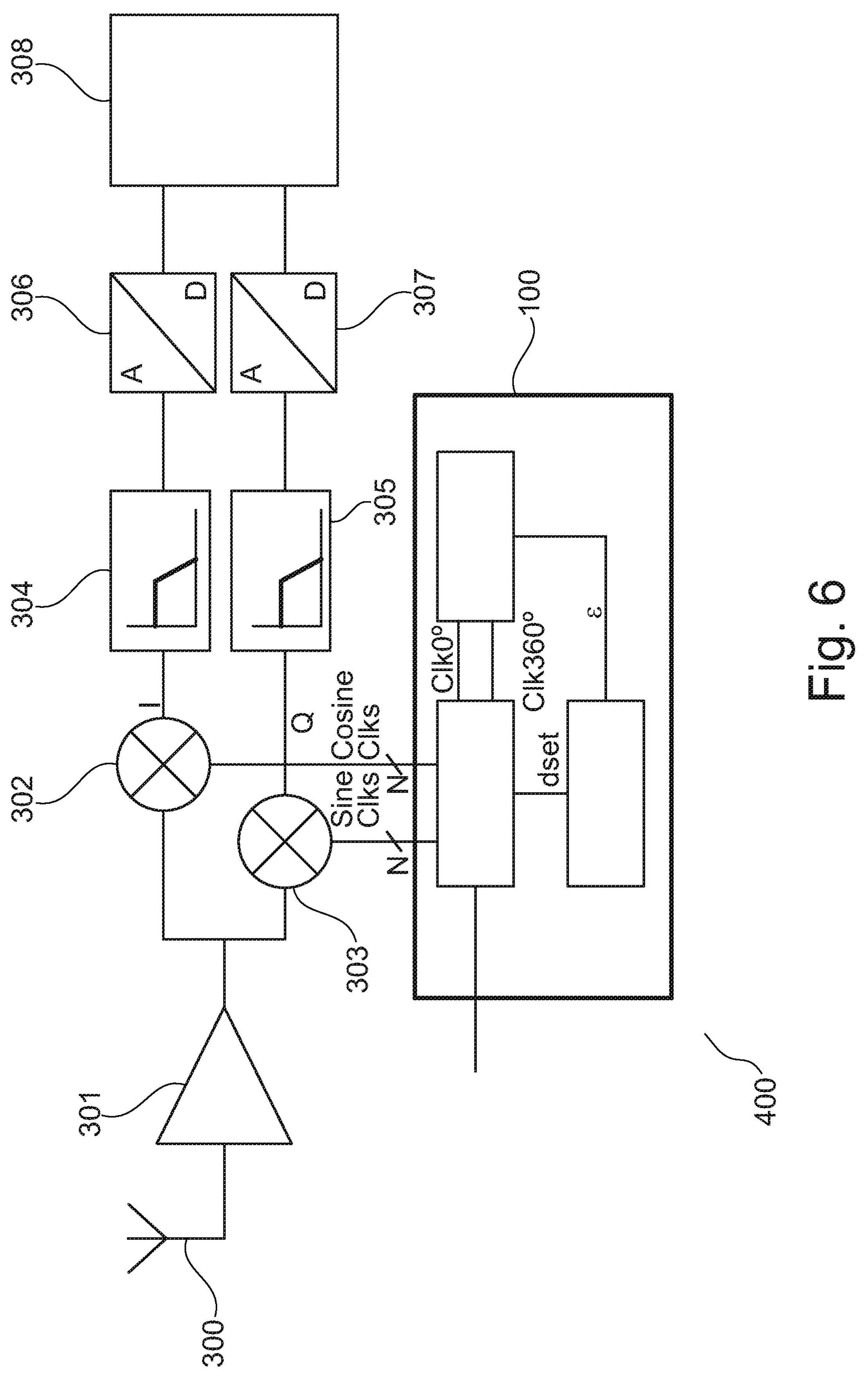

Various example embodiments may be more completely understood in consideration of the following detailed description in connection with the accompanying drawings, in which:

FIG. 1 is a principle diagram of a proposed multiphase clock generation device;

FIG. 2 is a diagram of a clock generation unit;

FIG. 3 is a diagram of a phase comparator unit;

FIG. 4 is a timing diagram of an output of an integrator depending on delays of clock signals;

FIG. 5 is a signal-flow diagram illustrating an exemplary method of determining a setting parameter, in accordance with the present disclosure;

FIG. 6 is a system-level diagram of a receiver device with a harmonic rejection mixer;

FIG. 7 is a timing diagram of an eight-phase approximated sine wave;

FIG. 8 is a table with gains of eight phases of the signal of FIG. 7;

FIG. 9 is a diagram showing harmonics of a multiphase clock signal; and

Figure 10:
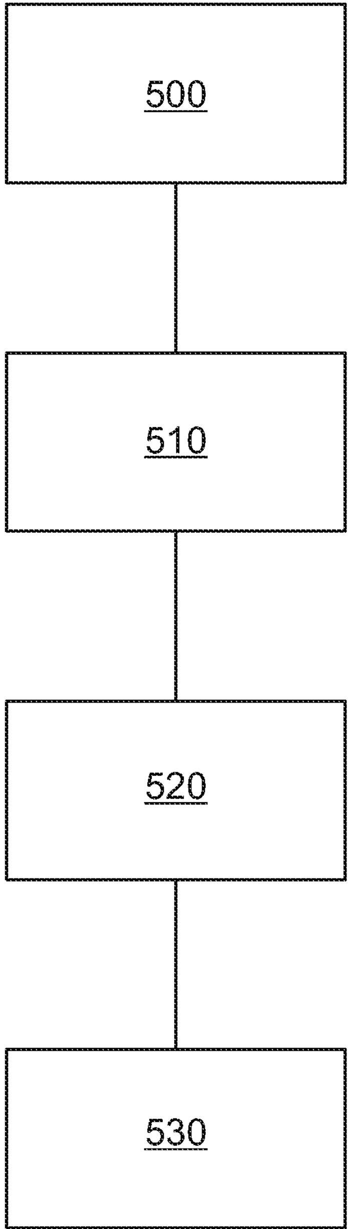

FIG. 10 is a flow diagram with a method according to the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DESCRIPTION OF EMBODIMENTS

The present disclosure proposes fast self-calibration circuitry for multi-phase clock generation. The present disclosure proposes multiphase clock generation with reduced area and power to be applied for analog harmonic rejection mixers by avoiding high frequency (e.g. PLL-generated) clock sources. The proposed device and method can be used for a harmonic rejection mixer or any other application which needs accurate delays (e.g. analog UWB pulse generation).

Aspects of the present disclosure are believed to be applicable to a variety of different types of apparatuses, systems and methods involving radar systems and related communications. In certain implementations, aspects of the present disclosure have been shown to be beneficial when used in the context of automotive radar in environments susceptible to the presence of multiple objects within a relatively small region. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference signs may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

In accordance with the present disclosure, FIG. 1 is a block diagram to illustrate an example of how the above-described aspects of a multiphase clock generation device may be implemented. Bearing in mind that aspects of the present disclosure are applicable to a variety of applications which use multiphase clock signals, FIG. 1 shows a multiphase clock generation device 100 with a clock generator unit 10, which is functionally coupled to a phase comparator unit 20. One recognizes an input 1, to which an input signal CLKp0 is applied. Out of the input signal several delayed clocks $CLK_{MP}$ are generated via delay elements. A phase comparator unit compares the input clock CLKp0 to one of the delayed clocks. In the illustrated 8-phase examples it compares CLKp0 to CLKn4, which is a 360° shifted clock and therefore should perfectly overlap with CLKp0 after calibration. The phase comparator unit 20 determines the sign of the phase error E and supplies said sign of the phase error E to a calibration unit 30. The calibration unit 30 determines a delay-calibration parameter $d_{set}$ and supplies said delay-calibration parameter $d_{set}$ to the clock generator unit 10, which outputs at a multi-phase clock signal $CLK_{MP}$. A multiphase clock signal $CLK_M P$ in the context of the present disclosure means a clock signal with at least two distinct phases.

The proposed multi-phase clock generation device could in principle also be used to only generate one delayed clock, but internally there needs to be at least two delay elements for the proposed phase comparator. One delay element would only lead to 180° shifted clocks which can be derived much simpler, via inverting clock signals.

Preferably, the proposed method of self-calibration is performed only once, e.g. after start-up of the device 100. Hence, the noise of the phase comparator is not relevant for the operation of the device and an electric current consumption can be optimized due to the switching-off the self-calibration circuitry 20 and 30.

FIG. 2 shows a clock generator unit 10 to generate eight phases of clock signals with four differential delay elements 11*a*-11*d*, however, the proposed principle can be used for any number of phases of clock signals. One recognizes the clock generator unit 10 with RC-networks $R_1C_1$, $R_2C_2$ (for 13.56 MHz: $R_1$, $R_2$ e.g. 48 kΩ, $C_1$, $C_2$ e.g. 250 fF), which are used to delay the clock edges of the signals CLKp0, CLKn0 by the desired amount for a generation of an eight-phase clock signal $CLK_{MP}$. The eight phases are assigned to the clock signals CLKn1, CLKp1, CLKp2, CLKn2, CLKn3, CLKp3, CLKp4 and CLKn4.

Alternatively, any other (e.g. current-controlled delay elements, not shown) circuitries can be used to delay clock edges as well. In the shown example, over process corner of the semiconductor process (defining process variations, etc.) there is a large variation of the RC time-constant (typically ~+/−40%) which needs to be calibrated for, otherwise in application like the mentioned harmonic rejection mixers, the harmonic levels of the multi-phase mixer are changed compared to the desired harmonic levels. Also any number of clock phases can be generated with the same scheme by reducing the delay of each individual delay cell and increasing the number of cells. The clock generation unit 10 can be used to generate a quadrature clock for an In-phase and Quadrature (I/Q) mixing scheme (as shown in FIG. 6), without a need to generate higher clock frequencies than the carrier-frequency. The self-calibration of the scheme exploits that the phase of the clkn4 (of the 8-phase example) output needs to be 360° (≡0°) offset as the clkp0 input if the multiphase clock generation device 100 is perfectly calibrated. Due to component matching, the delay of the individual delay cells 11*a* . . . 11*d* is provided within a certain accuracy (typically <1%). In the illustrated example, calibration is performed by adjusting the capacitor in the RC-networks in binary weighted steps. The delay cells 11*a* . . . 11*d* are chained together via inverting outputs to not accumulate systematic duty-cycle offsets in the chain.

One recognizes, that a phase setting of the multiphase clock signal depends on the number of delay cells, wherein the more delay cells 11*a* . . . 11*n* there are, the more finely the phase shift can be regulated. An exemplary value of phase shift obtained by means of a delay cell 11*a* . . . 11*n* is 45°.

An implementation in an exemplary 40 nm semiconductor process has shown that with <0.005 $mm^2$ semiconductor area and <150 uA less than −144 dBc/Hz phase noise can be achieved for a 13.56 MHz clock (at last delay stage output) at >100 KHz offset and less than 0.18% standard deviation of the delay of each cell after self-calibration. All values of components are given for an 8-phase clock generator with a 13.56 MHz clock signal CLKp0. The clock signal CLKn0 can be internally generated via an inverter.

FIG. 3 shows an implementation of a phase comparator unit 20 performing a calibration algorithm as a fast successive approximation procedure, that measures if the phase between the clock signals CLKp4 and CLKn0 is greater than 0°. If yes, then it signals to the calibration unit 30 that the delay should be reduced (e.g. via reducing the capacitor size by one step). The steps in the calibration unit 30 are applied in a binary weighted fashion (e.g. starting with 32% change and proceeding with 16%, 8%, 4% etc) until the desired accuracy is achieved. In this way, for example, already six steps can bring the accuracy down from +/−64% to +/−1%. With a high-bandwidth phase comparator unit 20 as shown, an adjustment is feasible with one step per carrier period. For example, for NFC (near field communication) with a 13.56 MHz carrier the whole self-calibration sequence can be finished in less than 1 μs.

The phase (-difference) comparator unit 20 works by integrating the difference of (CLKp4–CLKn4)–(CLKn0–CLKp0) by means of an integrator, which is implemented as an amplifier 21 with feedback capacitors C3, C4, using rising and falling edge of said clock signals. If the two differential inputs are phase aligned, no electric current is integrated by means of the integrator, thus an integrator output is zero. By choosing R and C appropriately, already very small phase differences can lead to large voltage change after 1 carrier period. E.g. the shown example for 13.56 MHz carrier, gives ~300 mV difference at integrator output for a 400 ps delay difference already after 1 carrier period (74 ns for NFC).

FIG. 4 shows a signal diagram of integrator output for two exemplary cases with slightly different delays of CLKp4. One recognizes, that with larger delay, the integrator delivers a greater output and is thus an indication of an alignment of clock signals. One recognizes in the lower part of FIG. 4 two time courses of the clock signal CLKp4, depicted as CLKp41 and CLKp42, wherein phases of CLKp41 and CLKp42 have slightly (400 ps) different delay to the clock input CLKp0. As a result of said different delays of CLKp41 and CLKp42, the integrator generates different electric voltages Vout1, Vout2, as shown in the upper part of FIG. 4. Sign of Vout1 is negative, signaling the calibration unit 30 that delay needs to be increased. Sign of Vout2 is positive, signaling the delay needs to be decreased.

FIG. 5 shows a flowchart of a recursive calibration process, which can be implemented as a fast delay-calibration algorithm, suitable for monotonic behaviour of the delay calibration parameter $d_{set}$. In a step 200 a delay-calibration parameter $d_{set}$ is set to mid setting in the following way:

$$d_{set}=(d_{max}+d_{min})/2$$

with:

$d_{max}$ . . . maximal delay (set to expected semiconductor-process maximum in first iteration)

$d_{min}$ . . . minimal delay (set to expected semiconductor-process minimum in first iteration)

In a step 201 it is checked whether the current iteration of the algorithm is the last iteration defined depending on the required calibration accuracy. If this is the case, the process branches to step 206, where the calibration process is finished.

If step 201 results in that the current iteration of the algorithm is not the last iteration, a phase error E is determined (by unit 21) in a step 202.

In step 203 it is checked, if the phase error ε is >0° (by unit 22). If this is not the case, there is no need to search for optimum setting above the current setting and thus the calibration process flow branches to step 204 where a calibration window is tightened in the following way:

$$d_{min}=d_{set}$$

If step 203 shows that the phase error E is greater than 0°, the calibration process flow branches to step 205, where the calibration window is tightened tin the following way:

$$d_{max}=d_{set}$$

Each iteration of the loop can be done as fast as one carrier period. $d_{min}$ and $d_{max}$ describes the boundaries in which the desired delay configuration is achieved. The initially set values of $d_{min}$ and $d_{max}$ are given by the maximum expected semiconductor process variation.

In effect, the flow of FIG. 5 represents a flow of a calibration procedure implemented as a binary search algorithm.

FIG. 6 shows an exemplary application of the proposed multiphase clock generation device 100. One recognizes that the clock generation unit 10 delivers multiphase clock signals used to form an approximated sine wave and an approximated cosine wave in quadrature (I/Q) mixers 302, 303. The I/Q mixers 302, 303 multiply an input signal from an antenna 300 which is fed to an LNA-amplifier 301 in order to provide down-converted signals to anti-aliasing filters 304, 305, subsequent A/D-converters 306, 307 and a subsequent DSP 308. In this way, a receiving unit 400 for an NFC-device with high harmonic rejection being driven by a multiphase clock generation device 100 can be realized, wherein the carrier is down converted into the base band before A/D conversion.

FIGS. 7, 8 and 9 give an example how an 8-phase clock-generator can be used for a mixer to reduce harmonic contents of the mixing product of the I/Q mixers 302, 303 of the receiving unit 400 of FIG. 6. In prior art the different phases for harmonic rejection mixers are generated from n×fc clock source (fc . . . carrier frequency; n>=4), since the timing of the clock phases needs to be accurate to deliver the desired harmonic rejection. To generate the phases in an analog way, delays with 1/(n*fc) or 360°/n can be used.

FIG. 7 shows an exemplary timing diagram of an approximated sine wave having been generated with eight phases. One recognizes four different gains or states 2, 5, −2 and −5 which are applied in the eight phases 0 to 7, which results in a wave form shown in FIG. 7.

FIG. 8 shows a table with the gains in the phases 0 to 7, which are input to the I-mixer 302 and to the Q-mixer 303.

FIG. 9 shows resulting harmonics from the mixing of the I/Q mixers 302, 303 obtained with the gains from the table of FIG. 8. Said harmonics should be as weak as possible in order to avoid down-conversion of unwanted frequency components to baseband.

FIG. 10 shows a flow of a proposed method to operate a multiphase clock generation device.

In a step 500 there are generated two or more phase-shifted clock signals out of a reference clock CLKp0.

In a step 510 there is determining a phase shift between signals input clock signals and at least one of the generated output clock signals.

In a step 520 there is determining a delay-calibration parameter $d_{se}t$ to compensate for process variation of the phase shift.

In a step 530 there are generated multi-phase clock signals $CLK_{MP}$ out of the reference clock CLKp0 and the delay-calibration parameter $d_{set}$.

The proposed device and its elements can be implemented at least partially as a software which can be stored in a computer readable memory or at least partially as a firmware or at least partially as a hardware of the multiphase clock generation device 100.

As examples, the specification describes and/or illustrates aspects useful for implementing the claimed disclosure by way of various circuits or circuitry which may be illustrated as or using terms such as blocks, modules, device, system, unit, controller, etc. and/or other circuit-type depictions. Such circuits or circuitry are used together with other elements to exemplify how certain embodiments may be carried out in the form or structures, steps, functions, operations, activities, etc. As examples, wherein such circuits or circuitry may correspond to logic circuitry (which may refer to or include a code-programmed/configured CPU), in one example the logic circuitry may carry out a process or method (sometimes "algorithm") by performing such activities and/or steps associated with the above-discussed functionalities. In other examples, the logic circuitry may carry out a process or method by performing these same activities/operations and in addition.

Compared to conventional locked-loops (e.g. DLL, FLL, PLL, etc.), there is provided a fast self-calibration routine only active at start-up, that can reduce electric current consumption during main operation, since the delay/phase measurement circuitry is disabled after initial calibration. Moreover, any noise from the phase-detector is not affecting phase-noise during the main operation.

Proposed is an analog multi-phase clock generation scheme with fast and accurate self-calibration which can be used e.g. for improved harmonic rejection compared to bipolar mixers. Advantageously, no high frequency reference clocks and no production trimming with external equipment are required.

An exemplary application is an NFC receiver with zero-IF down-conversion. However, the scheme be used for any RF receiver using an analog mixer to improve harmonic rejection.

The clock generator can also be used as a frequency multiplier without the use of a lock loop (FLL, PLL). Also other applications needing accurate clock phases, like analog pulse generation for UWB, can benefit from the present disclosure.

For example, in certain of the above-discussed embodiments, one or more modules are discrete logic circuits or programmable logic circuits configured and arranged for implementing these operations/activities. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described above is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the specification may make reference to a "first" type of structure, a "second" type of structure, where the adjectives "first" and "second" are not used to connote any description of the structure or to provide any substantive meaning; rather, such adjectives are merely used for English-language antecedence to differentiate one such similarly-named structure from another similarly-named structure.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps.

It should be noted that the term "comprising" does not exclude other elements or steps and "a" or "an" does not exclude a plurality. Also elements described in association with different embodiments may be combined. It should also be noted that reference signs in the claims should not be construed as limiting the scope of the claims.

The devices, apparatuses, units, elements, systems and methods described herein may at least partially be embodied by a computer program or a plurality of computer programs, which may exist in a variety of forms both active and inactive in a single computer system or across multiple computer systems. For example, they may exist as software program(s) comprised of program instructions in source code, object code, executable code or other formats for performing some of the steps. Any of the above may be embodied on a computer readable medium, which may include storage devices and signals, in compressed or uncompressed form.

As used herein, the term "computer" refers to any electronic device comprising a processor, such as a general-purpose central processing unit (CPU), a specific-purpose processor or a microcontroller. A computer is capable of receiving data (an input), of performing a sequence of predetermined operations thereupon, and of producing thereby a result in the form of information or signals (an output). Depending on the context, the term "computer" will mean either a processor in particular or more generally a processor in association with an assemblage of interrelated elements contained within a single case or housing.

The term "processor" or "processing unit" refers to a data processing circuit that may be a microprocessor, a co-processor, a microcontroller, a microcomputer, a central processing unit, a field programmable gate array (FPGA), a programmable logic circuit, or any circuit that manipulates signals (analog or digital) based on operational instructions that are stored in a memory. The term "memory" refers to a storage circuit or multiple storage circuits such as read-only memory, random access memory, volatile memory, non-volatile memory, static memory, dynamic memory, Flash memory, cache memory, or any circuit that stores digital information.

As used herein, a "computer-readable medium" or "storage medium" may be any means that can contain, store, communicate, propagate, or transport a computer program for use by or in connection with the instruction execution system, apparatus, or device. The computer-readable medium may be, for example but not limited to, an electronic, magnetic, optical, electromagnetic, infrared, or semiconductor system, apparatus, device, or propagation medium. More specific examples (non-exhaustive list) of the computer-readable medium may include the following: an electrical connection having one or more wires, a portable computer diskette, a random-access memory (RAM), a read-only memory (ROM), an erasable programmable read-only memory (EPROM or Flash memory), an optical fiber, a portable compact disc read-only memory (CDROM), a digital versatile disc (DVD), a Blu-ray disc (BD), and a memory card.

It is noted that the embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Moreover, it is noted that in an effort to provide a concise description of the illustrative embodiments, implementation details which fall into the customary practice of the skilled person may not have been described. It should be appreciated that in the development of any such implementation, as in any engineering or design project, numerous implementation-specific decisions must be made in order to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill.

It has to be noted that embodiments have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this application.

REFERENCE SIGNS

1 input
10 clock generator unit
11*a* . . . 11*n* delay cell
20 phase comparator unit
30 calibration unit
100 multiphase clock generation device
200 . . . 206 method steps
300 antenna
301 LNA
302 I-mixer
303 Q-mixer
304, 305 anti-aliasing filter
306, 307 A/D-converter
308 digital signal processor
400 receiving unit
500 . . . method steps
CLKp0 reference clock
$CLK_{MP}$ multiphase clock signal
$d_{set}$ delay-calibration parameter
$\varepsilon$ phase error
G gain
$V_{out}$ output of integrator

What is claimed is:

1. A multiphase clock generation device, comprising:
an input for feeding a reference clock;
a clock generation unit adapted to generate phase-shifted clock signals from the reference clock;
a phase comparator unit functionally coupled with the clock generation unit, wherein the phase comparator unit is adapted to measure a phase shift of the phase-shifted clock signals; and
a self-calibration unit functionally coupled with the clock generation unit, wherein the self-calibration unit outputs a delay-calibration parameter to the clock generation unit, wherein the clock generation unit is adapted to generate a multiphase clock signal out of the reference clock and the delay-calibration parameter.

2. The multiphase clock generation device according to claim 1, wherein the clock generation unit comprises at least two delay cells functionally coupled with each other, wherein each of the delay cells is adapted to generate phase shifted clock signals with respect to input clock signals.

3. The multiphase clock generation device according to claim 2, wherein the delay cells comprise trimmable delay elements, wherein a defined phase delay is generated by means of trimmable delay elements.

4. The multiphase clock generation device according to claim 3, wherein the trimmable delay elements include at least one of a resistor-capacitor (RC) network, a current-controlled delay element, a voltage-controlled delay element, or a digital-controlled delay element.

5. The multiphase clock generation device according to claim 3, wherein the phase comparator unit is adapted to perform phase detection with a binary or linear search algorithm used in the calibration unit.

6. The multiphase clock generation device according to claim 1, wherein a self-calibration process of the device is performed once before the generated clocks are used by a receiving circuitry.

7. The multiphase clock generation device according to claim 1, wherein the phase comparator unit is adapted to check if two clock-input signals are phase aligned, and depending on a phase shift, to integrate an electric current representing a phase difference.

8. The multiphase clock generation device according to claim 1, wherein the device is used to generate multiphase clock signals for a harmonic rejection mixer.

9. A method to operate a multiphase clock generation device, the method comprising:

receiving, at an input of the multiphase clock generation device, a reference clock;

generating, by a clock generation unit, two or more phase-shifted clock signals based on the reference clock;

determining, by a phase comparator unit coupled to the clock generation unit, a phase shift between the two or more phase-shifted clock signals;

determining, by a self-calibration unit coupled to the clock generation unit, a delay-calibration parameter to compensate for process variation of the phase shift;

providing the delay-calibration parameter to the clock generation unit; and generating, by the clock generation unit, a multi-phase clock signal based on the reference clock and the delay-calibration parameter.

10. The method of claim 9, wherein determining, by the phase comparator unit, the phase shift comprises:

determining, by the phase comparator unit, if two clock-input signals are phase aligned; and depending on a phase shift, integrating an electric current representing a phase difference using the phase comparator unit.

11. A multiphase clock generation device, comprising:

an input for feeding a reference clock;

a clock generation unit adapted to generate phase-shifted clock signals from the reference clock;

a phase comparator unit functionally coupled with the clock generation unit, wherein the phase comparator unit is adapted to measure a phase shift of the phase-shifted clock signals; and a self-calibration unit functionally coupled with the clock generation unit, the self-calibration unit outputs a delay-calibration parameter to the clock generation unit;

wherein:

the clock generation unit is adapted to generate a multiphase clock signal out of the reference clock and the delay-calibration parameter; and a self-calibration process is performed once before one or more of the generated phase-shifted clock signals or the multiphase clock signal are used by a receiving circuitry.

12. The multiphase clock generation device of claim 11, wherein the self-calibration unit is configured to be turned off after performing the self-calibration process.

13. The multiphase clock generation device of claim 11, wherein the clock generation unit comprises at least two delay cells functionally coupled with each other, wherein each of the at least two delay cells is adapted to generate phase shifted clock signals with respect to reference clock.

14. The multiphase clock generation device of claim 13, wherein each of the at least two delay cells comprises one or more trimmable delay elements configured to produce a defined phase delay.

15. The multiphase clock generation device according to claim 14, wherein the one or more trimmable delay elements comprise one or more of a resistor-capacitor (RC) network, a current-controlled delay element, or a digital-controlled delay element.

16. The multiphase clock generation device of claim 15, wherein the RC network is responsive to the delay-calibration parameter to adjust one or more capacitors in one or more binary weighted steps to alter timing of clock edges of the phase-shifted clock signals.

17. The multiphase clock generation device of claim 13, one or more of the at least two delay cells are responsive to the delay-calibration parameter from the self-calibration unit to alter timing of clock edges of the phase-shifted clock signals.

18. The multiphase clock generation device according to claim 11, wherein the phase comparator unit is adapted to check if two clock-input signals including one or more of the phase-shifted clock signals or the reference clock are phase aligned, and depending from a phase shift, to integrate an electric current representing a phase difference.

19. The multiphase clock generation device of claim 11, wherein the clock generation unit comprises one or more outputs coupled to a harmonic rejection mixer, the clock generation unit to provide one or more of the phase-shifted clock signals the one or more outputs.

20. The multiphase clock generation device of claim 11, wherein the phase comparator unit comprises:

a first amplifier including a first input to receive a first phase-shifted clock signal, a second input to receive a second phase-shifted clock signal, a first output, and a second output;

a first capacitor including a first terminal coupled the first input and a second terminal coupled to the first output; and a second capacitor including a first terminal coupled to the second input and a second terminal coupled to the second output; and a second amplifier including a first input coupled to the first output of the first amplifier, a second input coupled to the second output of the first amplifier, and an output coupled to the self-calibration unit, the second amplifier configured to provide a signal indicative of a phase difference between the first phase-shifted clock signal and the second phase-shifted clock signal.

* * * * *